United States Patent
Matsutani et al.

(10) Patent No.: US 7,052,624 B2
(45) Date of Patent: May 30, 2006

(54) MANUFACTURING METHOD FOR AN ELECTRONIC DEVICE, AND THE ELECTRONIC DEVICE

(75) Inventors: Tetsuya Matsutani, Kyoto (JP); Nobuhiro Jiwari, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 244 days.

(21) Appl. No.: 10/621,502

(22) Filed: Jul. 17, 2003

(65) Prior Publication Data
US 2004/0058535 A1 Mar. 25, 2004

(30) Foreign Application Priority Data
Jul. 18, 2002 (JP) .............................. 2002-209611

(51) Int. Cl.
*H01L 21/00* (2006.01)
(52) U.S. Cl. ............................ 216/84; 216/13; 216/17; 216/18; 438/14
(58) Field of Classification Search .................. 216/13, 216/17, 18, 84; 438/14
See application file for complete search history.

(56) References Cited

U.S. PATENT DOCUMENTS

| 6,204,075 B1 * | 3/2001 | Kikuchi ........................ 438/18 |
| 6,555,922 B1 * | 4/2003 | Nakagawa .................. 257/786 |
| 6,620,637 B1 * | 9/2003 | Noda .......................... 438/14 |

* cited by examiner

Primary Examiner—Shamim Ahmed

(57) ABSTRACT

The present invention provides a manufacturing method for an electronic device that enables high-yield manufacturing of electronic devices, by detecting potential short circuits between a contact plug and a conductive part contacting the periphery of the contact plug, directly after forming the contact plug; and the electronic device. The manufacturing method includes a hole-forming step of forming a contact hole in an insulating film that covers a conductive part formed on a first main surface of a substrate and an area surrounding the conductive part, the hole being formed beside the conductive part, and the conductive part including a first material; a material-supplying step of supplying a second material to the contact hole, the second material having a reactive property with the first material; and an inspection step, after the second material has been supplied, of inspecting for evidence of a reaction by the conductive part with the second material.

19 Claims, 8 Drawing Sheets

WASH, DRY

MANUFACTURING METHOD FOR AN ELECTRONIC DEVICE, AND THE ELECTRONIC DEVICE

BACKGROUD OF THE INVENTION (1) Field of the Invention

The present invention relates to a manufacturing method for an electronic device, and the electronic device. In particular, the present invention relates to a technique for detecting potential short circuits between conductive parts, including electrodes and wiring patterns, and neighboring contact plugs.

(2) Related Art

A memory that is an electronic device has a structure in which a plurality of field effect transistors (FETS) are mounted on a substrate with high density.

In this type of semiconductor device, each FET is composed of a source area and a drain area which are formed on the substrate with a narrow gap therebetween, and a gate electrode that is formed on the surface of the substrate in the gap using a gate oxidation film. The gate electrode and the surrounding area are then covered with an insulating film.

The source area and the drain area are connected to wiring on the insulating film by a contact plug that is provided in a thickness direction of the insulating film. The contact plug is formed by filling, with low-resistance tungsten, a contact hole that is provided between gate electrodes in neighboring FETs.

Demand for increasingly high integration in semiconductor devices is ever-present. In response to this demand, there is continual progress in reducing the width and pitch of gate electrodes, and the diameter of contact plugs. In, for example, 256 MB DRAMs (dynamic random access memories) that have become common lately, it is necessary to employ a fine construction so that the gate width is 0.18 µm. A so-called 0.18 µm gate width rule is provided as a specification for realizing this kind of fine structure.

When the gate electrode width is a fine 0.18 µm, the contact hole is formed by subjecting the insulating film formed by a resist film to an etching process.

In this kind of fine structure, a self-align contact structure is employed in order to prevent short circuits that often occur between parts of the electronic device such as the contact plug and the gate electrode. A self-align contact structure uses a silicon nitride layer as an etching stopper layer, and compared to an ordinary method of forming a contact hole, easily obtains a margin where the gate electrode and the contact area overlap. As a result, short circuits can be prevented in the fine structure.

However, a problem of short circuits between the contact plug and the gate electrode occurs when attempting to heighten the density of integration, even when a self-align contact structure is employed. Causes of such short circuits are thought to include the difficulty of positioning masks accurately when the manufacturing process is finer, and the need to manage conditions, such as etching time, more strictly. When this kind of undesired short circuit occurs between the contact plug and the neighboring gate electrode, an irregular state of connection occurs between the gate and the drain or the gate and the source in the FET, thereby preventing the semiconductor device from operating normally. In the case of a memory device, a short circuit in even one memory cell means that the whole device is defective.

Note that such undesired short circuits are not limited to occurring between the contact plug and the gate electrode, but may occur in the same way between, for instance, the contact plug and wiring provided in the insulating layer.

Conventionally, this problem is dealt with by detecting short circuits in an electric characteristic evaluation stage after processes such as diffusion and wiring have been completed. In other words, short circuits between the contact plug and the gate electrode, for instance, cannot be detected directly after forming the contact hole, but can only be detected after numerous processes have been completed. This means that great loses are incurred in terms of man-hours, materials and the like that are invested in the manufacturing process between the contact hole being formed and the electric characteristic evaluation stage.

In addition, if an irregularity occurs in the manufacturing process that causes short circuits, and the short circuits are not detected until the electric characteristic evaluation stage, there is a high possibility that short circuits will occur in all precursory devices from the contact hole forming process through to the electric characteristic evaluation stage. The damage would be great in such a case.

SUMMARY OF THE INVENTION

In order to solve the stated problems, the object of the present invention is to provide a manufacturing method for an electronic device that enables high-yield manufacturing of electronic devices, by detecting a potential short circuit between a contact plug and a conductive part that contacts the periphery of the contact plug, directly after forming the contact plug; and an electronic device that is manufactured using the manufacturing method.

In order to achieve the stated object, the present invention is a manufacturing method for an electronic device, including: a hole-forming step of forming a contact hole in an insulating film that covers a conductive part formed on a first main surface of a substrate and an area surrounding the conductive part, the hole being formed beside the conductive part, and the conductive part including a first material; a material-supplying step of supplying a second material to the contact hole, the second material having a reactive property with the first material; and an inspection step, after the second material has been supplied, of inspecting for evidence of a reaction by the conductive part with the second material.

In this method, when the conductive part is exposed in the contact hole formed in the hole-forming step, a reaction, such as elution, occurs between the first material and the second material in the material-supplying step. Consequently, in the inspection step, an inspection can be made for evidence of the reaction, and a potential short circuit can be detected correctly based on the result of the inspection. In other words, when evidence of a reaction is detected, it is determined that the conductive part is exposed in the contact hole, and therefore that an undesirable short circuit will potentially occur between a contact plug formed using the contact hole, and the conductive part.

Consequently, in the manufacturing method of the present invention, it can be accurately judged, in the inspection step directly after the hole-forming step, whether the conductive part is exposed in the contact hole. Therefore, electronic devices can be manufactured with high yield.

Specifically, evidence of the reaction in the inspection step is, for example, evidence of erosion of the conductive part. This erosion occurs when the second material is able to erode the conductive part. Evidence of erosion may be inspected for by employing, for instance, an optical microscope or an electron microscope.

Furthermore, the second material may have a selectively reactive property with the first material of the conductive part. Such a material is preferable because it does not damage the other compositional elements of the electronic device.

In the inspection step of the manufacturing method, it is possible, using an electron microscope (scan-type or the like), to check through the insulating film for a cavity caused by a reaction, or inspect for, after a material including at least the second material has been removed, presence of at least one of the first material and a compound of the first material and the second material in the removed material.

In this way, in the manufacturing method of the present invention, a potential short circuit between the contact plug and the conductive part can be detected directly after the contact hole is formed. Therefore, electronic devices can be manufactured with high yield.

Note that the second material is a substance that has superior reactive properties with the first material than with other materials in the electronic device.

In the manufacturing method, it is preferable that the first material is tungsten or a tungsten alloy, and that the second material is a solution that includes hydrogen peroxide or ozone.

More specifically, in the material-supplying step, the solution including hydrogen peroxide is contained in a vessel, and supplied to the contact hole under conditions by which the solution is able to selectively erode the conductive part.

Furthermore, the manufacturing method of the present invention can be applied to, for example, a memory device that includes a plurality of components that function as field effect transistors, and is particularly effective when using a fine design rule that stipulates an electrode (gate) width of 0.18 µm or less.

In the manufacturing method, it is preferable from the point of view of ease of inspection and reduction in the number of processes during manufacturing to form a large-area portion in the conductive part, and inspect the large-area portion in the inspection step. This large-area portion is sufficient in size to enable inspection with an optical microscope for evidence of a reaction. This method enables easy observation of evidence of a reaction by using an optical microscope (with a magnification of 50 to 100 times, for example). The relative inexpensiveness of such equipment makes this method superior in terms of manufacturing costs.

Furthermore, it is preferable to form an inspection area on the substrate that is independent of other circuit areas, subject a contact hole in the inspection area to the supply and in the material-supplying step, and subject a conductive part in the inspection area to the inspection in the inspection step. This method allows potential short circuits between the contact hole and the conductive part to be inspected for based on a plurality of standards. In addition, this method also enables inspection for the accuracy of the manufacturing process.

A self-align contact method may be used in the manufacturing method of the present invention to form the contact hole in the hole-forming step. In this case, it is preferable that the first material is a substance that has an etching selectivity ratio of 100 or higher to the material of the etching stopper layer, the insulating film and other layers.

It is further preferable that the material of the conductive part is a substance that has an etching selectivity ratio of 10,000 or higher to the material of the etching stopper layer, the insulating layer and other layers.

Furthermore, the present invention is an electronic device, including: a substrate on which a plurality of circuit areas are formed; and an insulating layer formed on a first main surface of the substrate, wherein at least one of the circuit areas is an inspection area that is independent of other circuits areas, and includes a conductive part and a contact hole, the conductive part being formed in the insulating film, and the contact hole neighboring a periphery of the conductive part.

The inspection area that is independent from other circuits in this electronic device can be used for inspecting for potential short circuits with an even higher degree of accuracy.

In this electronic device, a potential short circuit between the contact plug and the conductive part can be inspected for by inspecting exposure of the conductive part in the contact hole in the inspection area. This is advantageous in that a high yield can be achieved in manufacturing, and in terms of cost.

It is particularly preferable in this electronic device for the conductive part in the inspection area to include large-area portion for inspection, thus enabling increased ease of inspection. Specifically, if a large-area portion is provided in the conductive part, the absence or presence of a cavity can be confirmed easily at the inspection stage. This enables the inspection to be performed easily, and prevents reduction in yield that occurs when cavities are undetected. This is particularly superior in terms of the manufacturing process because evidence of a reaction can be inspected for using the above-described method with an optical microscope.

If the inspection area is formed in a scribe area of the substrate, waste is avoided when other circuit areas are cut from the substrate. In other words, the substrate can be used efficiently by forming the inspection area in the scribe area, which is originally a cutting margin that has no effective use.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIGS. 3A to 3C show processes up to immersion in an inspection solution 210 and evidence inspection, for detecting whether a tungsten film 3 is exposed in the contact hole 7a;

DESCRIPTION OF THE PREFERRED EMBODIMENTS

First Embodiment

The following describes a manufacturing method for a semiconductor device in the first embodiment of the present invention, with use of FIGS. 1A to 4B. The manufacturing method of the present embodiment is for a semiconductor device that functions as an FET and also functions as a switching element used in a memory or the like. For simplicity, FIGS. 1A to 4B show only part of the semiconductor device.

Figure 1A:
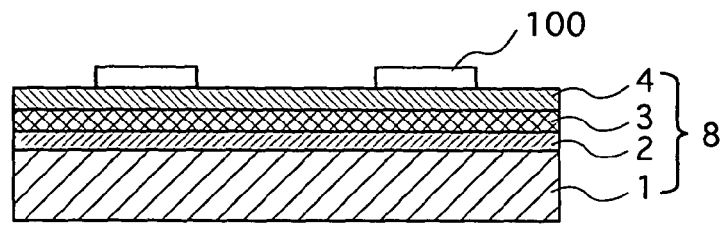
FIGS. 1A to 1D show processes through to forming a BPSG film 7 on a silicon substrate 1, in the semiconductor device manufacturing method of the first embodiment.
Figure 1A:

As shown in FIG. 1A, a silicon substrate 1 has a 100 nm-thick polysilicon film 2, a 80 nm-thick tungsten film 3, and a 200 nm-thick silicon nitride film 4 laminated thereon in the stated order. A silicon oxidated film which is not illustrated is formed on the surface of the silicon substrate before the stated films are laminated. Resist films 100 are formed on the silicon nitride film 4 in a pattern using a photolithography method. The width of each resist film 100 is set at approximately 130 nm, in consideration of the width of gates to be formed. The interval between each resist film 100 is, for example, approximately 180 nm.

The silicon substrate 1 on which the films have been formed as described is then subject to dry etching.

Figure 1B:
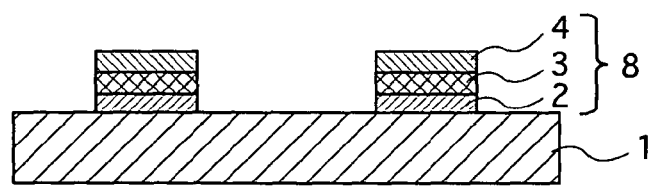
Figure 1B:

FIG. 1B shows the silicon substrate 1 after dry etching and removing the resist films 100.

The patterned polysilicon film 2, tungsten film 3 and silicon nitride film 4 have been etched into patterns as shown in FIG. 1B, thereby forming gate electrodes (polymetal electrodes) 8 on the silicon substrate 1.

Figure 1C:
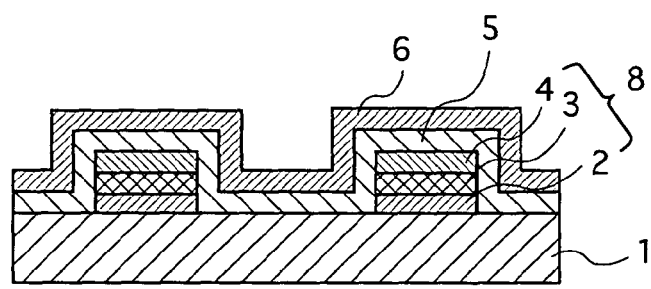
Figure 1C:
Figure 1D:
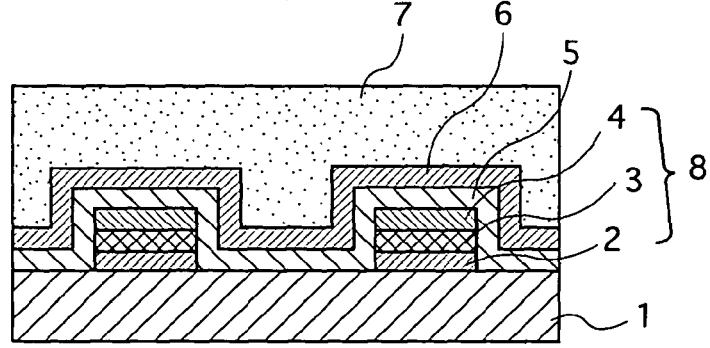

Although omitted in the drawings in the present embodiment, between the state in FIG. 1B and the state in FIG. 1C, a source area or a drain area is created in the area of the silicon substrate 1 between the gate electrodes by ion implantation of phosphorus or arsenic (n-type impurities).

Next, a TEOS ($Si(OC_2H_5)_4$) film 5 and a silicon nitrate ($Si_3N_4$) film 6, which acts as a stopper, are formed on the silicon substrate 1 on which the gate electrodes 8 have been formed. The TEOS film 5 is, for example, approximately 20 nm thick, and the silicon nitrate film 6 is, for example, approximately 50 nm thick.

After the TEOS film 5 and the silicon nitrate film 6 are formed, a BPSG (boron phosphorus silicon glass) film 7 is formed on the silicon nitrate film 6. The surface of the BPSG film 7 is smoothed by CMP (chemical mechanical polishing) to obtain a state such as that shown in FIG. 1D. Here, the thickest part of the BPSG film 7 is approximately 700 nm.

Next, a contact hole is formed in the thickness direction of the BPSG film 7 using a self-align contact method. This contact hole reaches from the surface of the BPSG film 7 through to the silicon substrate 1, between the gate electrodes 8. The method of forming the contact hole is described with use of FIGS. 2A to 2D.

Figure 2A:
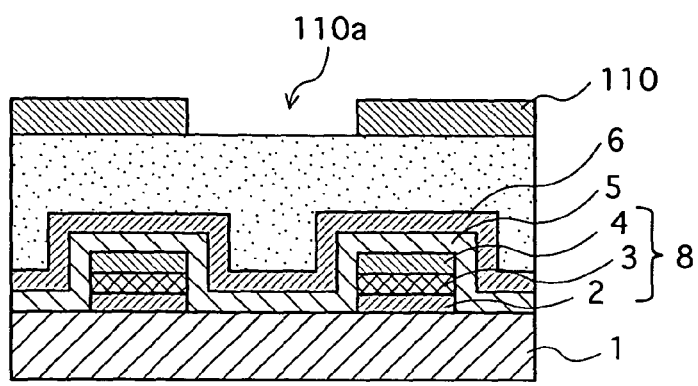
FIGS. 2A to 2D show a process for forming a contact hole 7a in the semiconductor device manufacturing method of the first embodiment.

A resist film 110 is layered on the BPSG film 7 as shown in FIG. 2A, and a photolithography mask is used to form a square opening 110a having sides of approximately 200 nm in the resist film 110 according to a photolithography method.

Figure 2B:
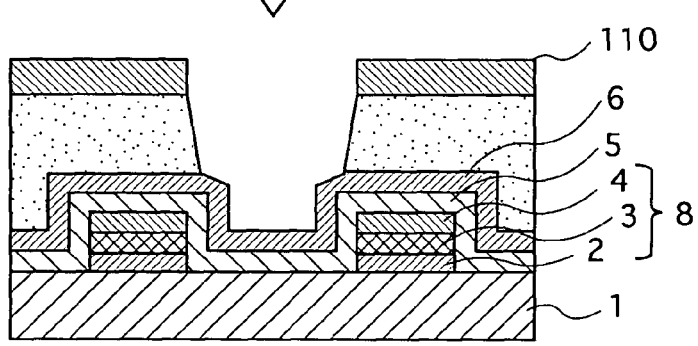

Next, as shown in FIG. 2B, the portion in the BPSG film 7 corresponding to the opening 110a is dry etched in a film-thickness direction through to the silicon nitride film 6 which acts as a stopper.

When the silicon nitride film 6 has been exposed, the etching gas is switched to $CHF_3$ (or $CH_2F_2$), and the silicon nitride film 6 and the TEOS film 5 are etched. In this way, a contact hole 7a is formed using a self-align method, without contacting the gate electrodes 8 even if the contact hole 7a is slightly out of alignment.

Figure 2C:
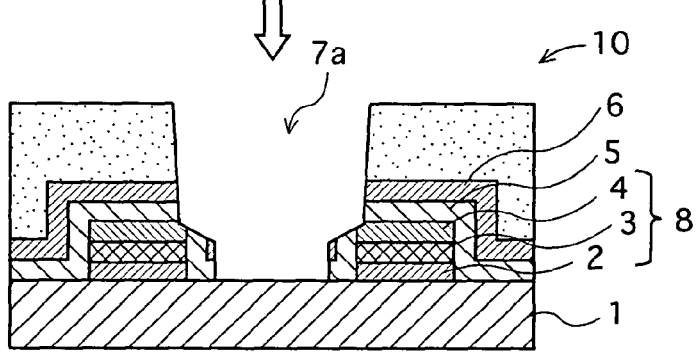

Here, if the etching is completed normally, the tungsten film 3 is not exposed in the contact hole 7a, as shown in FIG. 2C.

Figure 2D:
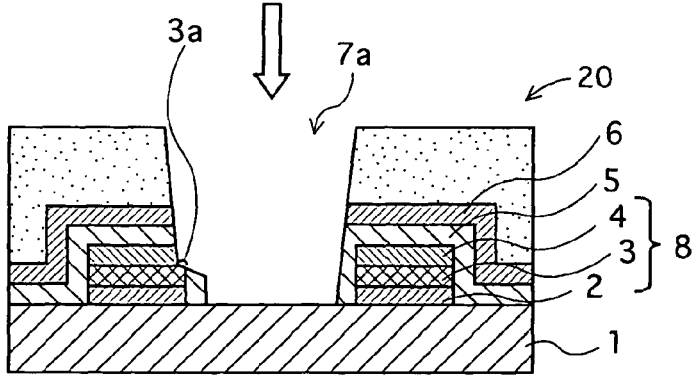

However, irregularities may occur in dry-etching conditions. Examples of such irregularities include the selectivity of the etching material being low in relation to the silicon nitride film 6, and misalignment of the position of the opening 110a during formation of the resist film 110 exceeding a permissible limit. Such irregularities may result in part of the tungsten layer 3 being exposed (exposed portion 3a) in the contact hole 7a, as shown in FIG. 2D. The exposed portion 3a in the contact hole 7a will cause a short circuit between the gate electrode 8 and a tungsten contact plug that is formed in a latter process.

Conventionally, this kind of short circuit is detected in an electric characteristic evaluation stage in the semiconductor device manufacturing process. However, this causes great losses in terms of man-hours, materials and the like invested in the manufacturing process from the contact hole formation process through to the electric characteristic evaluation process.

In contrast, in the present embodiment, a potential short circuit between the contact plug and the gate electrode 8 in a final stage of manufacturing is inspected for by checking whether or not the tungsten film 3 is exposed directly after the contact holes 7a is formed as shown in FIGS. 2A to 2D. The method of inspection used here is described with use of FIGS. 3A to 3C and 4A to 4B.

Figure 3A:
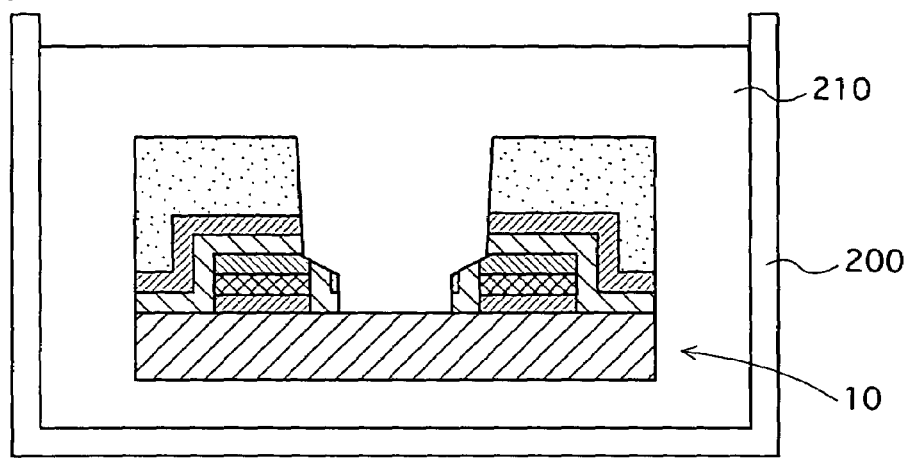
Figure 3B:
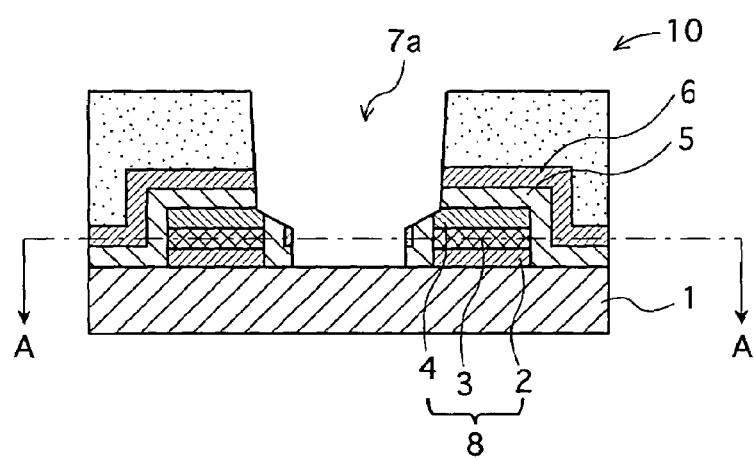

As shown in FIG. 3A, a precursory semiconductor device 10, which is in the state shown in FIG. 2C, is immersed in an inspection solution 210 in a vessel 200. The inspection solution 210 should have a composition such that it selectively reacts with tungsten but does not react with other materials on the silicon substrate 1. One example of the inspection solution 210 is a mixture of hydrochloric acid (30% by volume):hydrogen peroxide (30% by volume):pure water=1:1:5.

The precursory semiconductor device 10 is immersed for approximately 10 minutes in the inspection solution 210 at a temperature of approximately 75° C. The etching selectivity ratio of tungsten to the BPSG film 7 and the silicon nitride film 6 is 10,000 or higher. The tungsten is eluted easily, whereas the BPSG film 7 and the silicon nitride film 6 exhibit almost no elution. The elution rate of tungsten is 100 nm/min under the stated conditions.

The immersed precursory semiconductor device 10 is removed from the vessel 200, and after being washed and dried, the state (whether there is evidence of a reaction) of the tungsten film 3 is inspected. In the case of a precursory semiconductor device 10, such as that shown in FIG. 3B, where the tungsten film 3 is not exposed, a reaction does not occur because the inspection solution 210 and the tungsten film 3 do not come into contact. Therefore, evidence of a reaction is not found. In other words, the state of the precursory semiconductor device 10 before being immersed in the inspection solution 210 has not changed after immersion. This is shown in an A—A cross section in FIG. 4A.

Figure 4A:
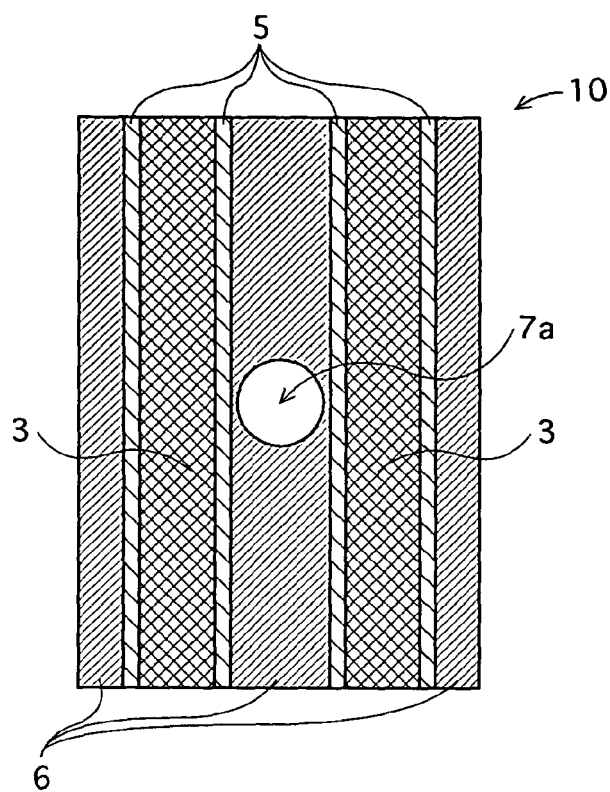
FIG. 4A is a plan view of the state of a tungsten film 3 when elution of the tungsten film 3 due to a reaction with a inspection solution 210 does not occur.

As shown in FIG. 4A, the tungsten film 3 is not eluted when the inspection solution 210 is supplied to the contact hole 7a because the tungsten film 3 is not exposed in the contact hole 7a.

In contrast, when the exposed portion 3a of the tungsten film 3 is present in a contact hole 7b, a reaction occurs between the tungsten of the exposed portion 3a and the hydrogen peroxide in the inspection solution 210 supplied to the contact hole 7b, resulting in the tungsten of the tungsten film 3 being eluted in the inspection solution 210.

Figure 3C:
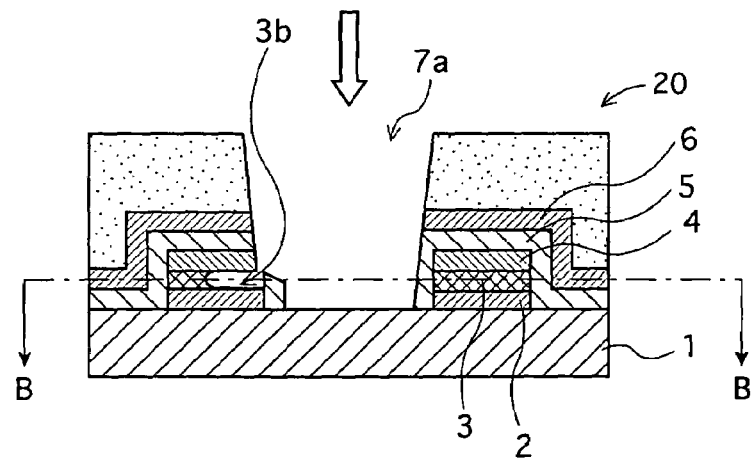

As shown in FIG. 3C, an eluted portion 3b develops in the tungsten film 3 whose tungsten has been partly eluted. In other words, a reaction occurs between the exposed portion 3a of the tungsten film 3 and the hydrogen peroxide in the inspection solution 210, and the tungsten film 3 is eroded starting from the exposed portion 3a, to create the eluted portion 3b. This is shown in a B—B cross section in FIG. 4B.

Figure 4B:
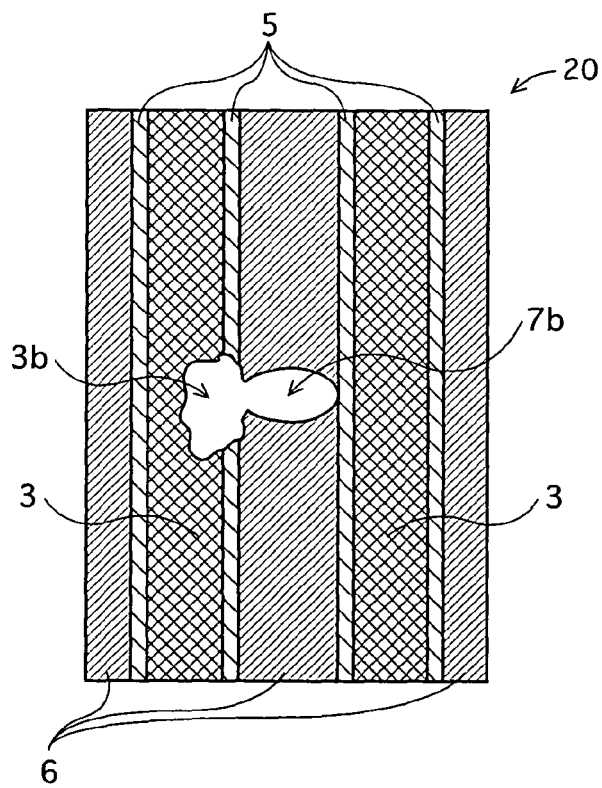
FIG. 4B is a plan view of the state of the tungsten film 3 when elution of the tungsten film 3 due to a reaction with the inspection solution 210 occurs.

As shown in FIG. 4B, part of the tungsten film 3 is eluted in a leftward direction in the drawing, resulting in the eluted portion 3b. It is not necessary to make a cross section sample such as that shown in FIG. 4B in order to confirm the existence of the eluted portion 3b. Instead, the eluted portion 3b can be confirmed through the BPSG film 7 using a scanning electron microscope which is capable of observing at a wafer level. This is possible because, even in the thickest part, the BPSG film 7 is extremely thin (700 nm).

A precursory semiconductor device 20 in which elution has been confirmed as occurring, such as shown in FIGS. 3C and 4B, is determined at this point to be defective, and is rejected from the production line.

In this way, the manufacturing method of the present embodiment enables inspection for a potential short circuit between the contact plug and the gate electrode 8 directly after forming the contact holes 7a and 7b, consequently avoiding the conventional manner of continuing to process the precursory semiconductor device 20, in which a short circuit may occur, after forming the contact hole.

As a result, the manufacturing method for a semiconductor device in the present invention reduces loss in terms of invested man-hours, materials and the like.

Furthermore, since a potential short circuit is detected directly after forming the contact holes 7a and 7b in the manufacturing method of the present embodiment, damage can be kept to a minimum if an irregularity occurs in manufacturing equipment, conditions or the like in the manufacturing process.

In other words, in the manufacturing method of the present embodiment, since defective products are detected directly after forming contact holes, the mountains of defective products that are conventionally accumulated from the contact hole forming process through to the electric characteristic evaluation process are avoided.

In addition, the presence of evidence of a reaction (eluted portion 3b) in a normal precursory semiconductor device 10, which does not have an exposed portion 3a and in which the eluted portion 3b is not present, can be inspected through the BPSG film 7 using an electron microscope. This prevents damage to quality products in which elution does not occur. In other words, a precursory semiconductor device 10 in which there is no elution of tungsten can be sent to the next process without being damaged.

Note that the inspection solution 210 in which the precursory semiconductor devices 10 and 20 are immersed is not limited to being the described mixture of hydrogen peroxide, hydrochloric acid and pure water. Anything that selectively reacts with tungsten and does not react with the other materials in the precursory semiconductor device may be used, examples being: hydrogen peroxide; a mixture of hydrogen peroxide and sulfuric acid; a mixture of ammonia water and hydrogen peroxide; and ozone water. When the target material is a material other than tungsten, an inspection solution may be determined taking selectivity into consideration.

Furthermore, in the present embodiment, inspection is not limited to being for potential short circuits between the contact plug and the gate electrode. Instead, the method of the present embodiment may be used, for example, when manufacturing a multi-layer semiconductor device in which a wiring layer is formed in the BPSG film 7, to inspect for potential short circuits between the contact plug and the wiring layer.

Furthermore, in the first embodiment inspection for a potential short circuit is not limited to being performed by inspecting the eluted portion 3b in the tungsten film 3. For example, after the inspection solution 210 is removed from the contact hole 7a or 7b, it is possible to inspect for the presence of tungsten in addition to the inspection solution 210 in the removed liquid.

Furthermore, although the manufacturing method of the present embodiment is described as being applied to manufacture of a semiconductor device that has an FET area, the manufacturing method may be applied to manufacture of an electronic device in which a conductive part covered by an insulating film is formed on a substrate, and a process is performed for providing a contact hole in a position that contacts the periphery of the conductive part.

Second Embodiment

In the first embodiment, inspection is performed using actual circuit portions in the precursory semiconductor devices 10 and 20. However, in the manufacturing method of the present embodiment, an inspection area is provided in advance on the silicon substrate 1, and the inspection area is used to inspect for potential short circuits.

Figure 5:
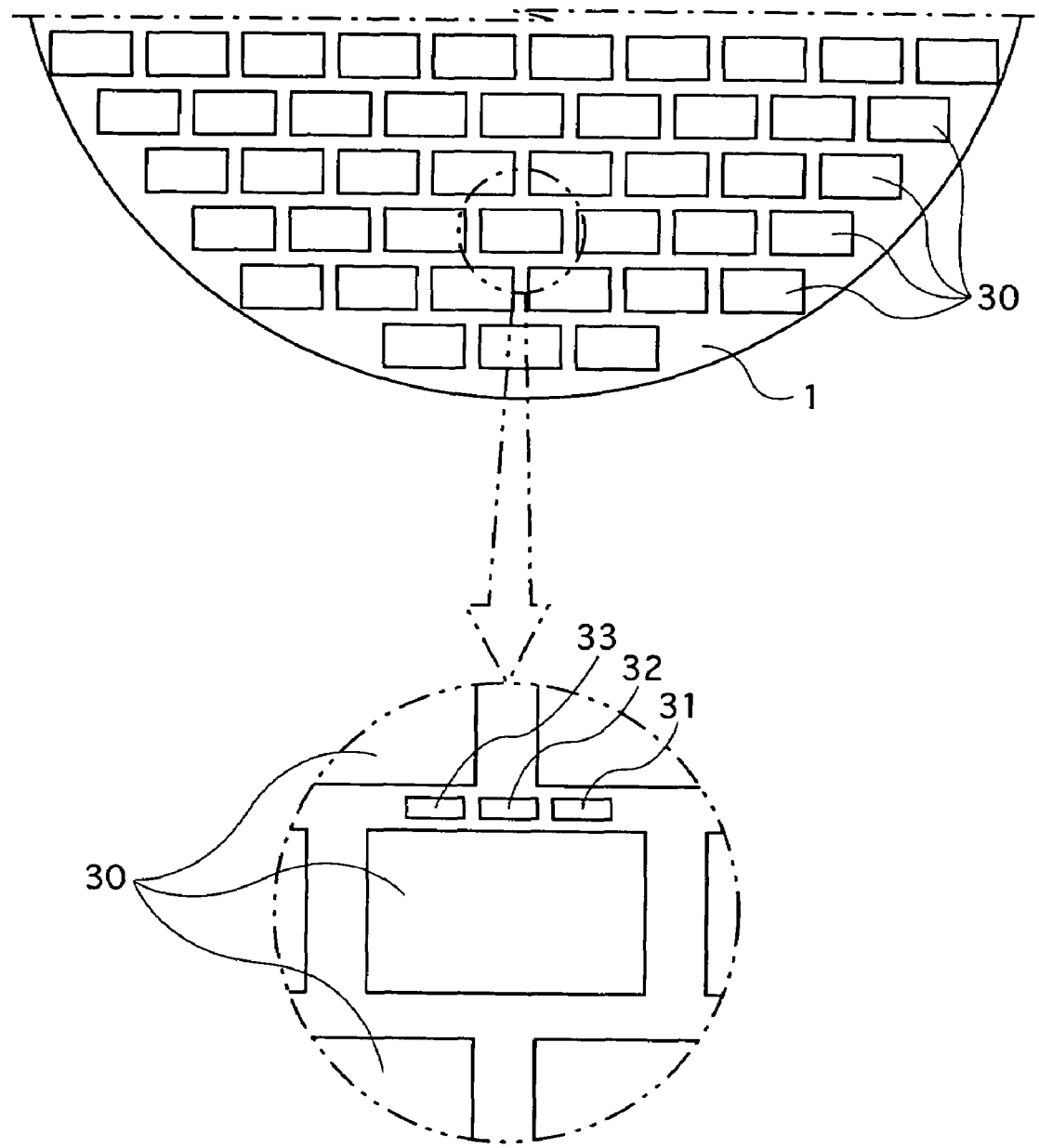
FIG. 5 is a plan view of the silicon substrate 1 in the manufacturing method of the second embodiment.

First, as shown in FIG. 5, a plurality of circuit areas 30 are provided with gaps therebetween on a thin, round silicon substrate 1. The gaps are referred to as a scribe area, and are a cutting allowance for cutting circuit areas 30 apart in the final stage of manufacturing.

As the enlarged portion in FIG. 5 shows, in the present embodiment, inspection areas 31, 32, and 33 are provided in line in the scribe area. Each of the inspection areas 31, 32, and 33 is composed of a silicon oxide film, agate electrode including tungsten, a TEOS film, a silicon nitride film, a BPSG film, and so on, as in the first embodiment.

Each of the inspection areas 31, 32 and 33 has a resist film layered on the BPSG film. Each resist film has an opening 110a the same as shown in FIG. 2A. Each opening 110a is formed using a mask that is identical to that used to form the opening in the resist film in the circuit area 30. In other words, the position of the opening 110a is formed with the same degree of accuracy in the circuit area 30 and the inspection areas 31, 32, and 33.

Figure 6A:
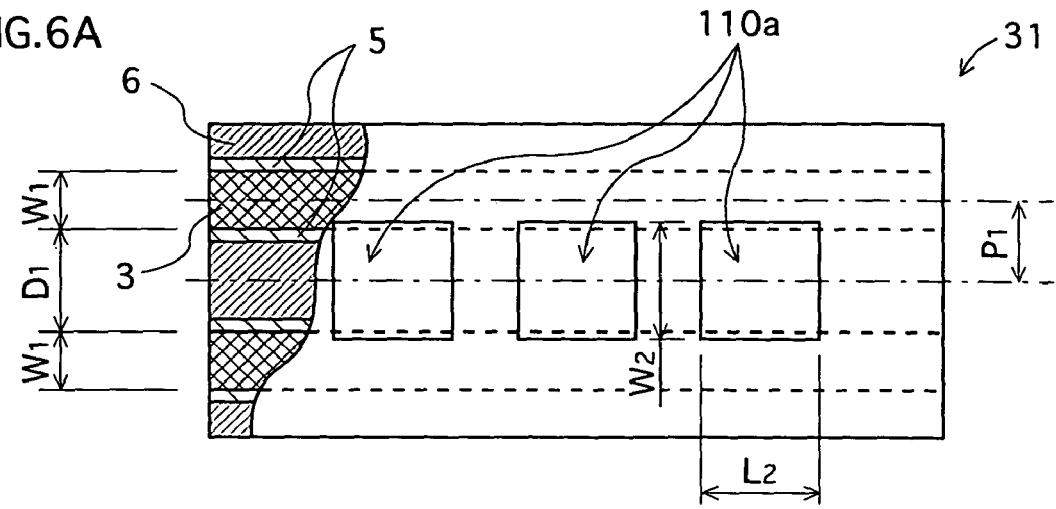
FIGS. 6A to 6C are plan views (and partial cross sections) of inspection areas 31, 32, and 33, respectively, used in the manufacturing method of the second embodiment.
Figure 6B:
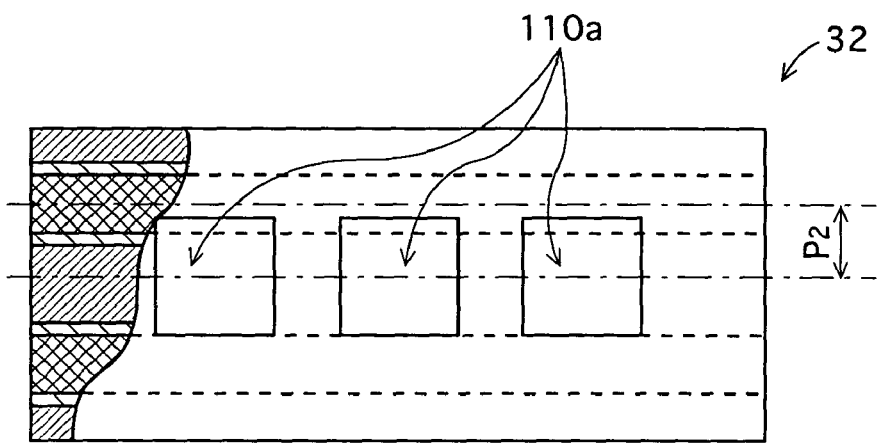
Figure 6C:
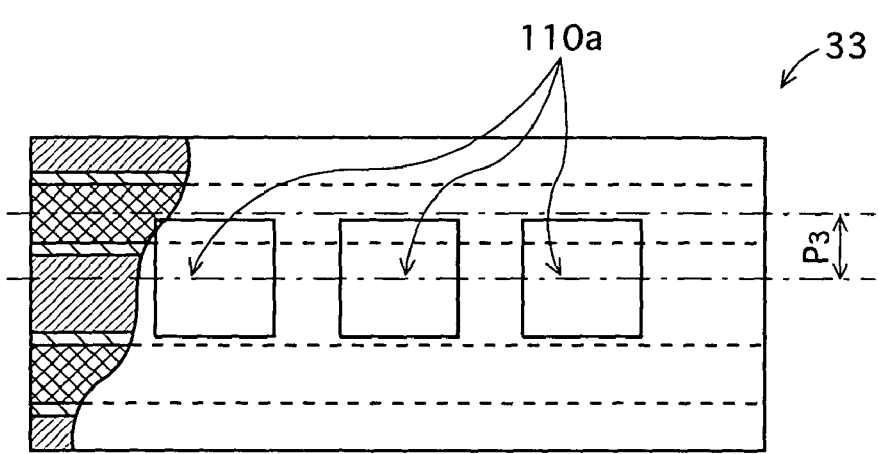

The characteristics of the inspection areas 31, 32 and 33 are described with use of FIGS. 6A to 6C. Each of FIGS. 6A to 6C is a plan view showing a resist film 110 which is formed on the BPSG film 7 and has openings 110a.

In the inspection area 31 of the pattern shown in FIG. 6A, the width of each tungsten film 3 is 180 nm, and the interval between tungsten films 3 is 180 nm, as described earlier.

Furthermore, the dimensions of each opening 110a are W2 (for example, 200 nm) in a vertical direction in the drawing and L2 (for example, 200 nm) in a horizontal direction.

The distance between the center of the tungsten film 3 and each opening 110a, in other words, the design pitch between the tungsten film 3 and each contact hole, is set as P1 (for example 180 nm).

In the inspection area 32 of the pattern shown in FIG. 6B, the design pitch between the tungsten film 3 and each opening 110a in the resist film is set as P2 (for example, 150 nm), which is slightly smaller than P1.

In the inspection area 33 of the pattern shown in FIG. 6C, the design pitch between the tungsten film 3 and each opening 110a in the resist film is set as P3 (for example, 120 nm), which is smaller than both P1 and P2.

The patterns shown in FIGS. 6B and 6C are identical to the pattern shown in FIG. 6A, other than the pitch between the tungsten film 3 and the openings 110a.

In the manufacturing method of the present embodiment, the three inspection areas 31, 32 and 33 are formed in advance on the silicon substrate 1 as a set, and potential short circuits are inspected for using the method shown in FIG. 3. In addition to inspecting the precursory device itself, the inspection areas 31, 32, and 33 can be used to detect irregularities in the manufacturing process. Suppose, for example, that elution of tungsten in the contact hole in the inspection area 33, which has the smallest pitch, is detected, but evidence of elution in the contact holes in the inspection areas 31 and 32 is not detected. From this it can be judged that there are no irregularities in the precursory semiconductor device itself, but that there are signs of some kind of trouble in the manufacturing process (for example, a loss of accuracy in positioning). If, for example, evidence of elution of tungsten in the contact hole in the inspection area 32 in the pattern in FIG. 6B is detected, it can also be judged that while there are no problems with the precursory semiconductor device itself, there are serious irregularities in the manufacturing process. Furthermore, if elution of tungsten in the inspection area 31 in the pattern shown in FIG. 6A is detected, it can be judged that irregularities are serious enough to stop the manufacturing process, and that the precursory semiconductor device is defective.

The standards for making such judgements may be determined in advance through experimentation.

As has been described, the semiconductor device manufacturing method of the present embodiment enables potential short circuits in a precursory semiconductor device to be detected, as well as signs of problems in the manufacturing process. Therefore, semiconductor devices can be manufactured with minimal losses (in terms of man-hours invested and materials) in the manufacturing process, and with high yield.

Note that the number of inspection areas (number of detection levels) in the precursory semiconductor device is not limited to the three inspection areas 31, 32 and 33 described in the present embodiment. For example, the pitch P between the openings 110a and the tungsten layers 3 may be set finely, and numerous inspection areas formed in the scribe area, to enable detailed detection. Alternatively, one or two inspection areas may be sufficient.

Note that, as in the first embodiment, the inspection solution 210 has a property by which it reacts selectively with tungsten and does not react with the other compositional materials of the precursory semiconductor device.

Furthermore, the described manufacturing method can be applied to an electronic device in which a conductive part covered with an insulating film is formed on a substrate, and a contact hole is provided so as to contact the periphery of the conductive part. As in the first embodiment, the target of detection may be between the contact plug and the wiring layer.

Furthermore, the inspection areas are not limited to being formed in the scribe area, but may be formed on any otherwise-unused part of the silicon substrate 1.

Third Embodiment

Figure 7A:
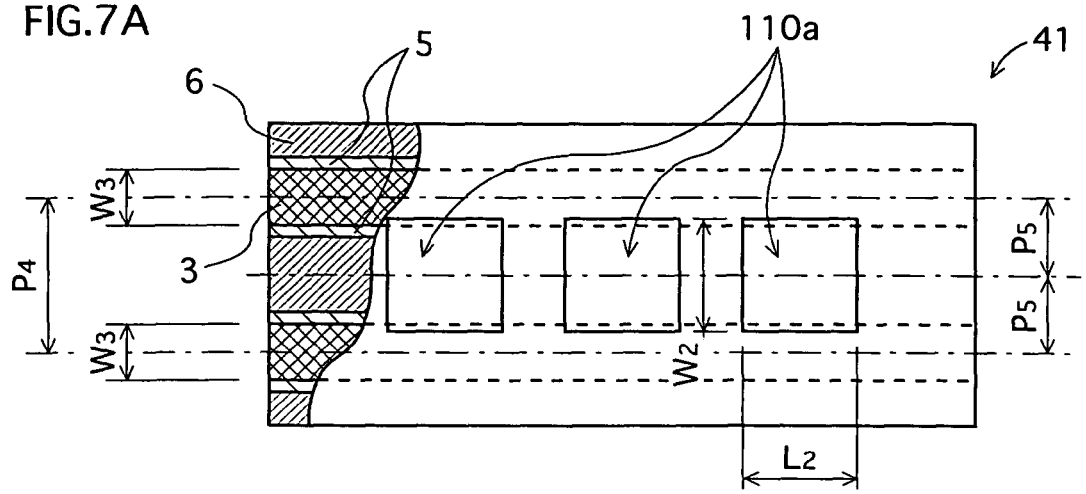
FIGS. 7A to 7C are plan views (and partial cross sections) of inspection areas 41, 42, and 43, respectively, used in the manufacturing method of the third embodiment.
Figure 7B:
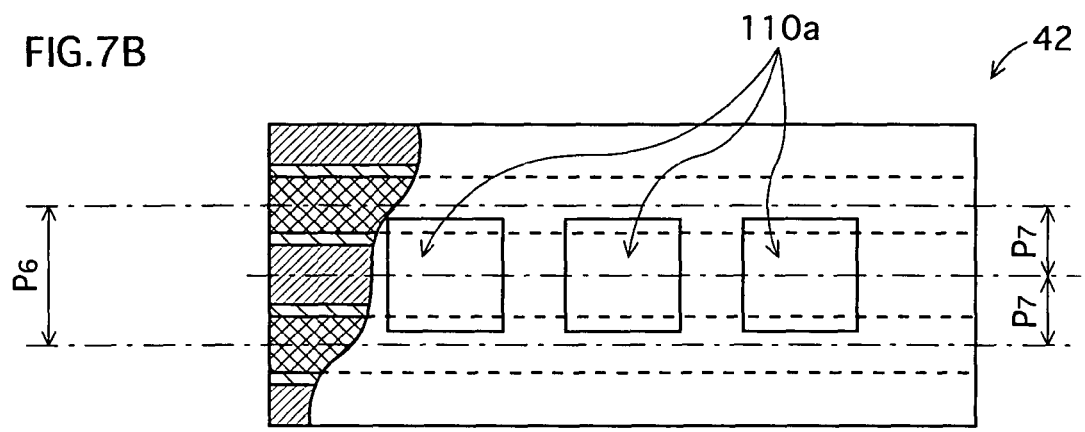
Figure 7C:
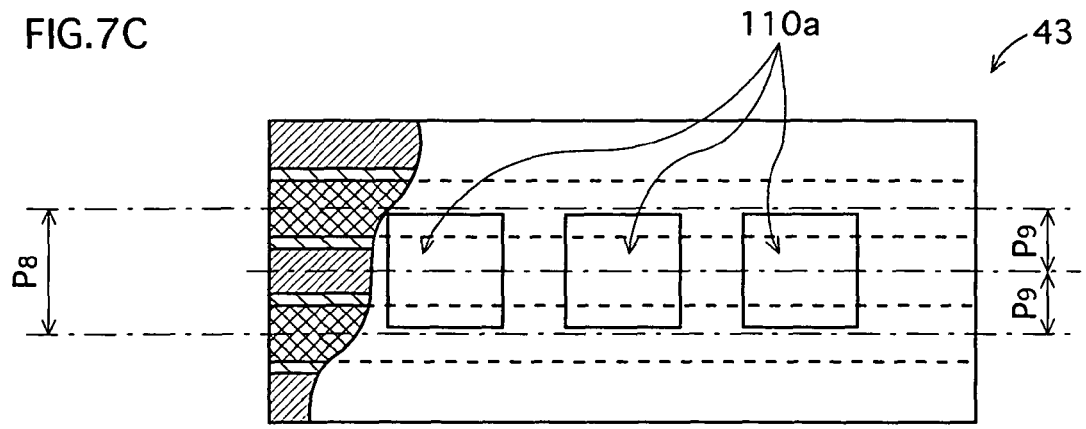

The following describes the semiconductor device manufacturing method of the third embodiment with use of FIGS. 7A to 7C. FIGS. 7A to 7C are plan views of the silicon substrate 1 on which inspection areas 41, 42, and 43, respectively, are formed. As in the second embodiment, the inspection areas 41, 42, and 43 are formed in the scribe area or the like.

The three inspection areas 41, 42, and 43 shown in FIGS. 7A to 7C respectively are formed as one set using a mask that is used in forming the circuit area 30. This process is the same as for forming the inspection areas 31, 32 and 33. The following describes the characteristics of each of the inspection areas 41, 42 and 43.

The difference between FIGS. 7A to 7C is the pitches P4, P6, and P8 between neighboring tungsten films 3. Accordingly, in each inspection area 41, 42, and 43 and the pitches P5, P7, and P9 between the tungsten films 3 and the openings 110a are different.

Specifically, the pitches are set here as follows: P4=360 nm, P6=330 nm, and P8=300 nm, and accordingly P5=180 nm, P7=165 nm, and P9=150 nm.

Note that the width W3 of the tungsten film 3 and the dimensions W2 and L2 of the openings 110a are the same as in FIG. 6.

A precursory semiconductor device in which the three inspection areas 41, 42, and 43 are formed as described is more suitable for detecting potential short circuits in a manufacturing method of an electronic device that has a self-align contact structure, than the detection patterns in the second embodiment. The reason for this is as follows.

Specifically, when forming a contact plug in a self-align contact structure, the size of the gaps (pitch) between conductive parts has more influence on potential short circuits between the contact plug and conductive part that contacts the periphery thereof, compared to an electronic device that does not have a self-align contact structure. In the semiconductor device manufacturing method of the present embodiment, this characteristic of the self-align contact structure is exploited to detect potential short circuits with high precision.

Since three inspection areas are provided, the semiconductor device manufacturing method of the present embodiment may also be used to inspect for signs of problems in the manufacturing process with high precision, in addition to inspecting for potential short circuits in the semiconductor device.

Therefore, in the semiconductor device manufacturing method of the present embodiment the potential of a short circuit between the contact plug and the gate electrode or the wiring layer can be detected directly after the contact hole is formed. As a result, semiconductor device manufacturing can be performed efficiently, and a high yield maintained.

Note that although three levels of patterns of inspection areas are formed in the third embodiment, the number of patterns (number of levels) is not limited to three.

Furthermore, in the present embodiment inspection is not limited to being performed between the contact plug and the tungsten film 3 of the gate electrode 8 as shown in FIG. 7, but may be performed between the contact plug and the wiring layer or the like.

Fourth Embodiment

In the second and third embodiments the eluted portion 3b is inspected for in the 180 nm-wide tungsten film 3 after immersing the precursory semiconductor device in the inspection solution 210, using an electron microscope. However, in the manufacturing method of the present embodiment inspection can be performed with low magnification using an optical microscope. The manufacturing method of the present embodiment is described with use of FIG. 8.

Figure 8:
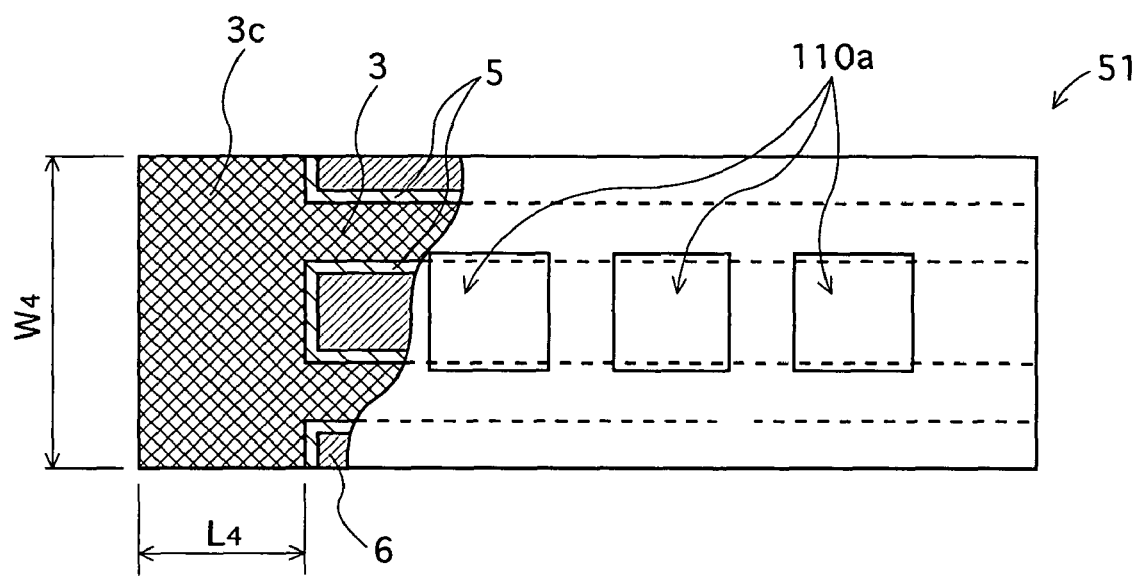
FIG. 8 is a plan view (and partial cross section) of an inspection area 51 used in the manufacturing method of the fourth embodiment.

As shown in FIG. 8, in the manufacturing method of the present embodiment, a portion having a relatively large area (hereinafter referred to as "large-area portion 3c") is formed in the tungsten film 3 in the inspection area 51. The dimensions of the large-area portion 3c are, for example, W4=30 μm and L4=20 μm.

An inspection area that includes the tungsten film 3 that has the large-area portion 3c is formed in the scribe area or the like on the silicon substrate 1, and inspection for potential short circuits are performed as shown in FIG. 3.

Suppose that part of the tungsten film 3 is exposed in the contact hole 7b, and the tungsten is eluted by being immersed in the inspection solution 210 as described earlier. Here, the eluted portion 3b develops towards the large-area portion 3c and increases in size as immersion time elapses.

The eluted portion 3b whose erosion has reached the large-area portion 3c can be easily detected with low magnification (for example, magnified 50 to 100 times) using an optical microscope, rather than high magnification using an electron microscope as described earlier.

Consequently, providing the large-area portion 3c in the tungsten film 3 in the inspection area 51 as described in the present embodiment is effective in enabling easy inspection.

Note that the large-area portion 3c in the present embodiment may be formed using a combination of the methods in the second and third embodiments to enable even more effective inspection.

Other Items

The manufacturing method and the semiconductor device of the present invention shown in the first to fourth embodiments are merely examples, and, other than the inspection of the tungsten film 3 in the contact holes 7a and 7b, which is the gist of the present invention, the manufacturing method and the semiconductor device of the present invention are not limited to the described embodiments. For example, if the described techniques are applied to a case in which a contact plug is formed between a source electrode and a drain electrode formed on the silicon substrate 1, potential short circuits between the contact plug and the electrodes can be inspected for.

Furthermore, instead of a mixture of hydrogen peroxide and hydrochloric acid used in the embodiments, the inspection solution 210 may be, for example, a mixture of sulfuric acid (98% by weight):hydrogen peroxide (30% by weight) =5:1, or a mixture of ammonia water (30% by weight): hydrogen peroxide (30% by weight):pure water=1:1:5.

Furthermore, in the first to fourth embodiments, tungsten, which has an etching selectivity ratio of 10,000 or higher in regard to the etching stopper layer and the insulating film (BPSG film 3 and silicon nitride film 6), is used as the material for the conductive part. However, the same kind of effect can be achieved with a material that has an etching selectivity ratio of 100 or higher.

Furthermore, the manufacturing method is not limited to being applied to a semiconductor device as described in the first to the fourth embodiments, but may be applied to any electronic device in which a conductive part covered by an insulating film is formed on a substrate, and processing is performed for providing a contact hole in a position that contacts the periphery of the conductive part.

The precursory semiconductor device 10 is not limited to being immersed in the inspection solution 210 at 75° C. for 10 minutes. Any conditions under which the inspection solution 210 is able to selectively erode the tungsten film 3 are possible.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A manufacturing method for an electronic device, comprising:
   a hole-forming step of forming a contact hole in an insulating film that covers a conductive part formed on a first main surface of a substrate and an area surrounding the conductive part, the hole being formed beside the conductive part, and the conductive part including a first material;
   a fluid-supplying step of supplying a second fluid material to the contact hole, the second fluid material having a reactive property with the first material; and
   an inspection step, after the second fluid material has been supplied, of inspecting for evidence of a reaction by the conductive part with the second fluid material.

2. The manufacturing method of claim 1, wherein
   the reactive property of the second fluid material causes the conductive part to be eroded on contact with the second fluid material, and
   in the inspection step, evidence that the conductive part has been eroded is inspected for.

3. The manufacturing method of claim 2, wherein
   in the inspection step, evidence of erosion is inspected for optically.

4. The manufacturing method of claim 3, wherein
   in the inspection step, evidence of erosion is inspected for after removing the second fluid material from the contact hole.

5. The manufacturing method of claim 4, wherein
   the first material is one of tungsten and a tungsten alloy, and
   the second fluid material is a solution including one of hydrogen peroxide and ozone.

6. The manufacturing method of claim 5, wherein
   in the fluid-supplying step, the solution is supplied to the contact hole under a condition by which the solution is able to selectively erode the conductive part.

7. The manufacturing method of claim 1, wherein
   the electronic device is a memory device that includes a plurality of components that function as field effect transistors, and
   the conductive part is a function electrode that is formed before the hole-forming step by applying a design rule that stipulates an electrode width of 0.18 μm or less.

8. The manufacturing method of claim 3, wherein
   the conductive part includes a large-area portion that is sufficient in size to enable inspection thereof with an optical microscope for evidence of the reaction, and in the inspection step, evidence of the reaction in the large-area portion is inspected for.

9. The manufacturing method of claim 2, wherein
in the inspection step, after a material including at least the second fluid material has been removed, presence of at least one of the first material and a compound of the first material and the second fluid material is inspected for in the removed material.

10. The manufacturing method of claim 1, wherein
the substrate has a pre-formed inspection area that is independent of other circuits areas,
in the fluid-supplying step a contact hole formed in the inspection area is subject to the inspection, and
in the inspection step, a conductive part formed in the inspection area is subject to the inspection.

11. The manufacturing method of claim 1, wherein
in the hole forming step, the contact hole is formed using a self-align contact method.

12. The manufacturing method of claim 11, wherein
a silicon nitride film is provided on the substrate as an etching stopper layer in the hole forming step.

13. The manufacturing method of claim 12, wherein
the insulating film is formed of boron phosphorus silicon glass, and
the first material has an etching selectivity ratio of 100 or higher in relation to material that composes the etching stopper layer and material that composes the insulating film.

14. An inspection method for a semiconductor member having a plurality of layers of at least two different materials formed on a substrate with portions thereof selectively removed to provide one of an electronic device and a pre-form thereof, comprising:
applying a fluid having a first characteristic property of being non-reactive to those exposed layers of the plurality of layers when one of the electronic device and the pre-form thereof is properly fabricated and a second characteristic of being reactive to one or more layers of the plurality of layers that are not exposed when properly fabricated; and
detecting a fluid reaction with one or more of materials to determine a flaw in fabrication of the one of the electronic device and the pre-form.

15. The inspection method of claim 14 wherein the step of detecting is performed with a scanning electron microscope.

16. The inspection method of claim 14 wherein the fluid reaction erodes away one or more of the different materials.

17. The inspection method of claim 14 wherein the fluid reaction provides an eluted byproduct.

18. The manufacturing method of claim 1, wherein
the electronic device is a memory device that includes a plurality of components that function as field effect transistors.

19. The manufacturing method of claim 1, wherein
the conductive part is a function electrode.

* * * * *